(12) United States Patent
Jeong (10) Patent No.: US 6,780,715 B2
(45) Date of Patent: Aug. 24, 2004

(54) METHOD FOR FABRICATING MERGED DRAM WITH LOGIC SEMICONDUCTOR DEVICE

(75) Inventor: Yong Sik Jeong, Chungchongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 111 days.

(21) Appl. No.: 10/274,052

(22) Filed: Oct. 21, 2002

(65) Prior Publication Data

US 2003/0077859 A1 Apr. 24, 2003

(30) Foreign Application Priority Data

Oct. 24, 2001 (KR) .................................... 2001-0065793

(51) Int. Cl.[7] ................ H01L 21/8234; H01L 21/8242; H01L 21/336
(52) U.S. Cl. ...................... 438/275; 438/241; 438/258; 438/279; 438/286; 438/926
(58) Field of Search ............................... 438/241, 258, 438/200, 201, 275, 279, 286, 926

(56) References Cited

U.S. PATENT DOCUMENTS 6,074,908 A    6/2000  Huang
6,107,154 A    8/2000  Lin
6,458,655 B1 * 10/2002 Yuzuriha et al. ............ 438/257
6,503,800 B2 *  1/2003 Toda et al. .................. 438/279

* cited by examiner

Primary Examiner—James Klinger
Assistant Examiner—Jennifer M. Kennedy
(74) Attorney, Agent, or Firm—Birch, Stewart, Kolasch & Birch, LLP (57) ABSTRACT

A method is disclosed for fabricating an MDL (Merged DRAM Logic) semiconductor device, in which silicide is formed on a logic region and a memory region selectively for enhancing device reliability. The method includes the steps of (a) providing a substrate having a first region and a second region adjoining the first region, (b) forming a first gate forming material layer in the first region, (c) forming a second gate forming material layer in the first region having the first gate forming material layer formed therein and the second region, (d) selectively patterning the second gate forming material layer to form second gates in the second region and a boundary dummy pattern layer at a boundary area of the first and second regions, and (e) selectively patterning the first gate forming material layer to form first gates in the first region.

20 Claims, 11 Drawing Sheets

METHOD FOR FABRICATING MERGED DRAM WITH LOGIC SEMICONDUCTOR DEVICE

RELATED APPLICATION

This application claims the benefit of Korean Application No. P2001-65793 filed on Oct. 24, 2001 under 35 USC § 119, which is hereby incorporated by reference.

BACKGROUND OF THE INVENTION

1. Field of the Invention

The present invention relates to a semiconductor memory, and more particularly, to a method for fabricating an MDL (Merged DRAM with Logic) semiconductor device, in which silicide is formed selectively on a logic region and a memory region for enhancing the device reliability.

2. Discussion of the Related Art

As a device packing density increases, the MDL type device is born in a form where a memory (DRAM) and a logic circuit are merged into one chip as a previous stage of a system on chip product for meeting different demands of consumers. Recently, because the MDL composite chip has advantages of providing a small sized, high speed device with a low EMI (Electro Magnetic Interference) and with a low power consumption, researches on the development of the MDL composite chip with a memory product and a logic product formed on one chip, are active in many fields. However, an MDL fabrication process itself is complicated and difficult because a process for fabricating the memory product and a process for fabricating the logic circuit need to be taken into consideration at the same time.

A related art method for fabricating an MDL semiconductor device will be explained with reference to the attached drawings. FIGS. 1A–1J illustrate sectional views showing the steps of a related art process for fabricating an MDL semiconductor device, FIGS. 2A–2F illustrate sectional views showing the steps of another related art process for fabricating an MDL semiconductor device, and FIGS. 3A–3E illustrate sectional views showing the steps of still another related art process for fabricating an MDL semiconductor device.

In general, in the related art MDL semiconductor device, a logic part is required to have high performance while a memory part is required to have reliability. To satisfy these requirements, a gate oxide film with different thicknesses is applied to each of the logic region and the memory region of the device, and a dual poly structure is employed in a transistor in the logic region. In the logic region, for improving device packing density and performance, salicide structures are employed in a gate surface and active surface. In the memory region, for improving the reliability and refresh characteristics, a diffusion active region is employed.

In order to simplify the fabrication process in the related art MDL semiconductor device, either a polycide gate structure (FIGS. 2A–2F) or a salicide gate structure (FIGS. 3A–3E) is employed for forming identical gate structures in the memory region and the logic region. Alternatively, taking characteristics of each region into consideration, a polycide structure is employed in the memory region and the polycide region is removed from the logic region to form a gate according to the fabrication steps shown in FIGS. 1A–1J.

The steps of a related art process for fabricating the MDL semiconductor device will now be explained in more detail referring to FIGS. 1A–1J.

Figure 1A:
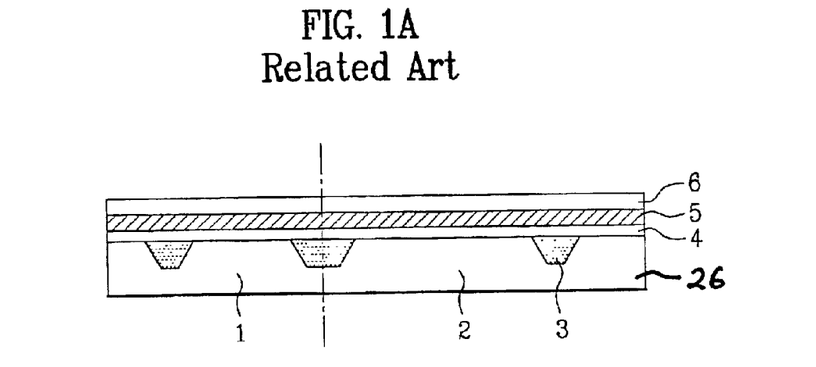
FIGS. 1A–1J illustrate sectional views showing the steps of a related art process for fabricating an MDL semiconductor device.

At first, referring to FIG. 1A, a device isolation layer 3 is formed in a semiconductor substrate 26 (or a well region (not shown)) having a logic region 1 and a memory region 2 divided by a boundary line B. In this instance, if an NMOS transistor formation region is taken into consideration, doping concentration in the logic region 1 and the memory region 2 may differ. That is, for improving cell refresh characteristics of the memory region 2, the doping concentration of the memory region 2 may be made relatively low. Then, a first gate oxide film 4 with a first thickness and a first gate forming material layer 5 are formed on the entire surface of the substrate 26 in succession. The first gate forming material layer 5 is formed of undoped polysilicon. Then, a first capping layer 6 of oxide or nitride is formed on the first gate forming material layer 5 for preventing etch damage to the gate layer during the gate etching process.

Figure 1B:
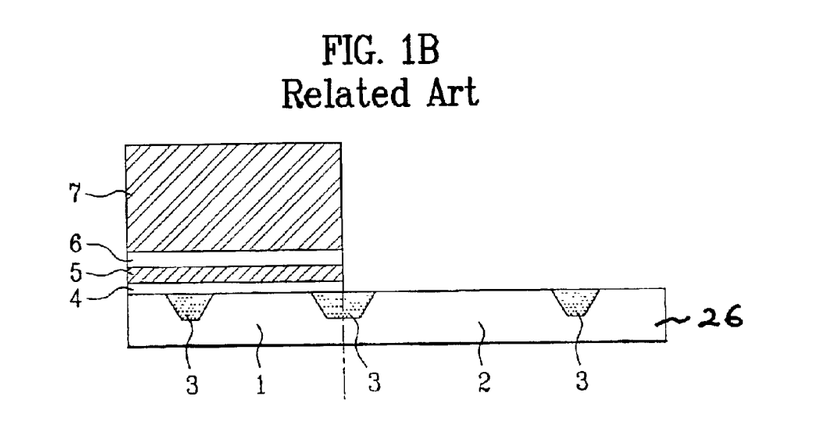

Referring to FIG. 1B, a photoresist layer is formed on the entire surface of the substrate and patterned selectively for forming a first photoresist pattern layer 7 in the logic region 1 and not in the memory region 2. The exposed first capping layer 6, first gate forming material layer 5, and first gate oxide film 4 are etched selectively by using the first photoresist pattern layer 7 as a mask so that no layer remains above the memory region 2 of the substrate 26. Thereafter, the first photoresist pattern layer 7 is removed.

Figure 1C:
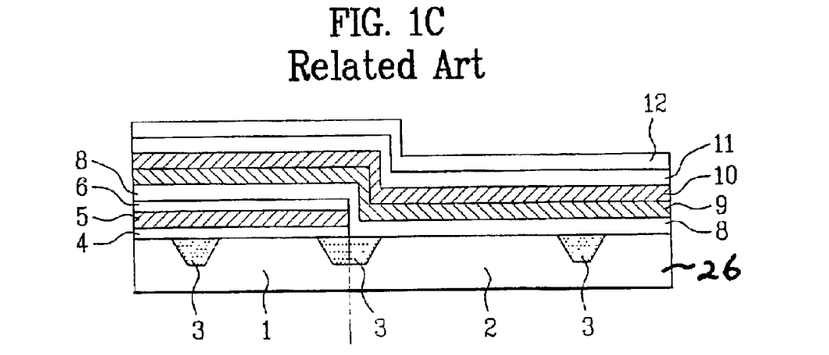

Referring to FIG. 1C, a second gate oxide film 8 with a second thickness thicker than the first thickness of the first gate oxide film 4, a second gate forming material layer 9 for forming a memory, a tungsten silicide layer 10 and second capping layers 11 and 12 are formed in succession on the entire surface of the resultant structure. In this instance, a polycide structure is used to improve the reliability of the memory and a capacitor forming process to be applied later. The second capping layers 11 and 12 are a stack of an oxide film (11) and a nitride film (12).

Figure 1D:
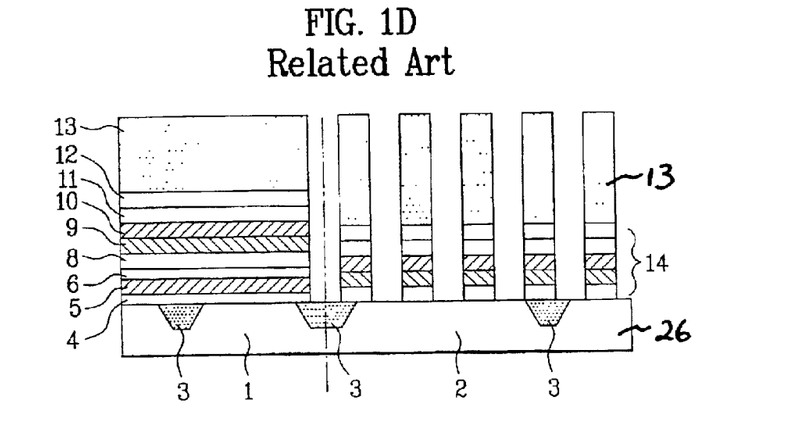

Referring to FIG. 1D, photoresist is applied on the entire surface of the resultant structure, and patterned selectively to form a second photoresist pattern layer 13 for patterning a wordline in the memory region 2. A stack of the layers 8, 9, 10, 11, and 12 in the memory region 2 is etched selectively by using the second photoresist pattern layer 13 as a mask, to form gates 14 of a DRAM cell. Thereafter, the second photoresist pattern layer 13 is removed.

Figure 1E:
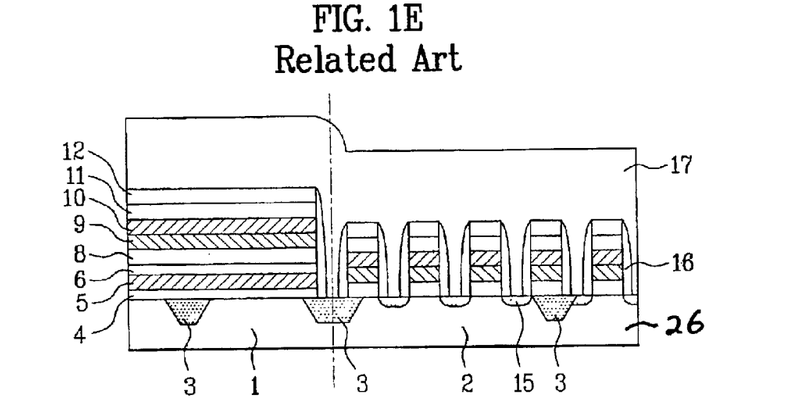

Referring to FIG. 1E, source/drain regions 15 are formed in surfaces of the substrate 26 in the exposed memory region 2 by using the gates 14 as a mask. Then, a sidewall spacer forming layer made of oxide or oxide/nitride is formed on the entire resultant structure and etched back to form DRAM sidewall spacers 16 at the sides of each gate 14 of a DRAM cell to form a storage node contact by SAC (Self-Aligned-Contact) in the following process. At the same time, a sidewall spacer is formed at the side of the stack of layers 4-6 and 8-12 in the logic region 1. Then, a material such as BPSG (Boron-Phosphorus-Silicate-Glass), PSG (Phosphorus-Silicate-Glass), HDP (High Density Plasma), or SOG (Spin On Glass) is deposited on the entire surface of the resultant structure to form a gap filling material layer 17 filling the gaps in the memory region 2 and the logic region 1.

Figure 1F:
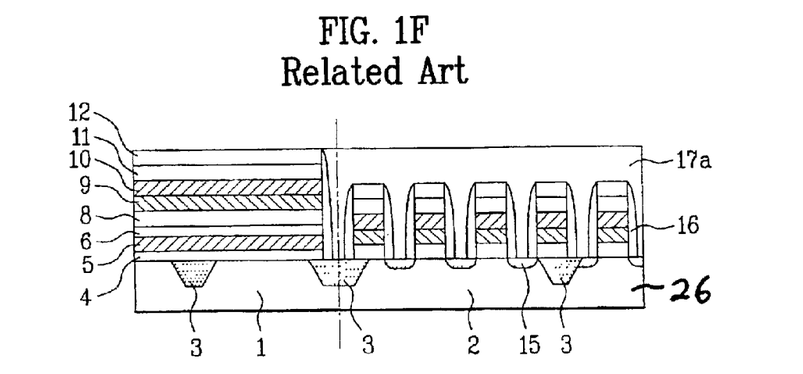

Referring to FIG. 1F, the gap filling material layer 17 is planarized by CMP (Chemical Mechanical Polishing) to form a DRAM gate gap filling layer 17a.

Figure 1G:
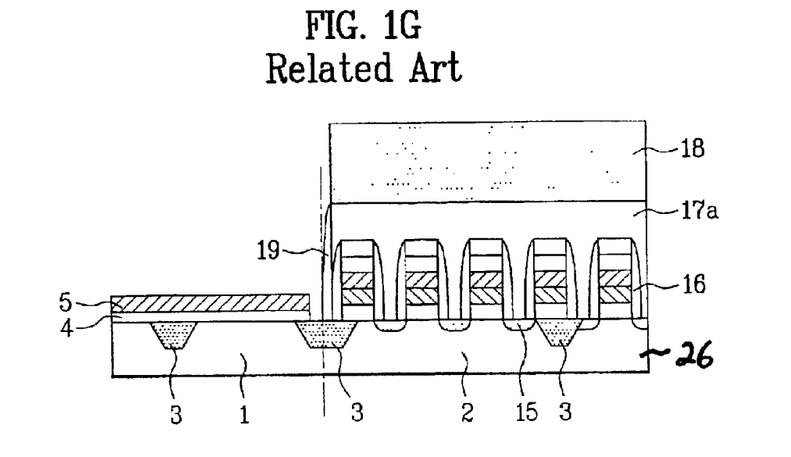

Referring to FIG. 1G, photoresist is coated on the entire surface of the resultant structure, and patterned to leave the photoresist only in the memory region 2 as a third photoresist pattern layer 18. Then, material layers 6, 8, 9, 10, 11, and 12 for forming a DRAM, which remained in the logic region 1, are removed by using the third photoresist pattern layer 18 as a mask to expose the first gate forming material layer 5 in the logic region 1. In this instance, there remains a residual layer 19 at an interface between the logic region 1 and the memory region 2. Thereafter, the third photoresist pattern layer 18 is removed.

Figure 1H:
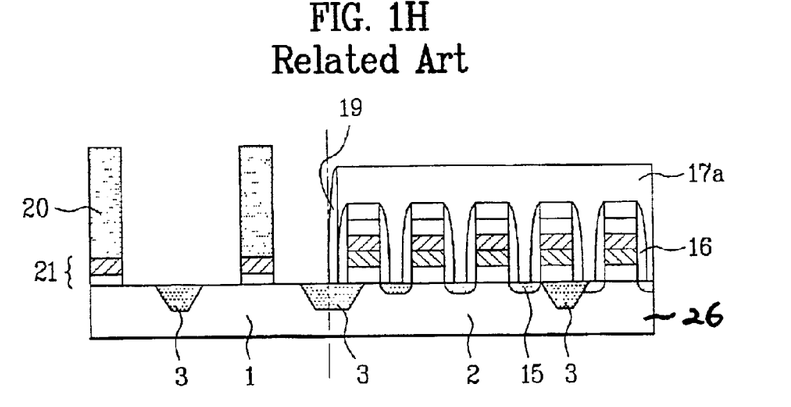

Referring to FIG. 1H, photoresist is coated on the entire surface of the resultant structure, and patterned selectively to form a fourth photoresist pattern layer 20 on the first gate forming material layer 5 in the logic region 1 for forming a logic gate. Then, the first gate oxide film 4 and the first gate forming material layer 5, both in the logic region 1, are selectively etched by using the fourth photoresist pattern layer 20 as a mask, to form logic gates 21. The fourth photoresist pattern layer 20 is removed.

Figure 1I:
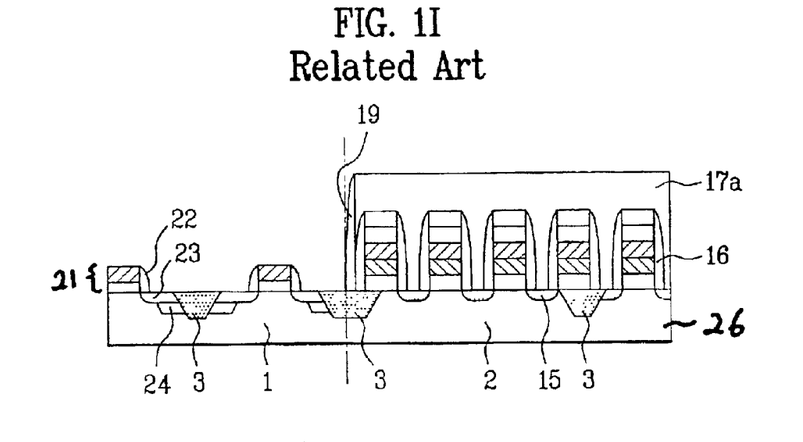

Referring to FIG. 1I, impurities are lightly doped into surfaces of the substrate 26 in the exposed logic region 1 to form LDD (Lightly Doped Drain) regions 23. Logic sidewall spacers 22 are formed at the sides of the logic gates 21. Then, impurities are heavily doped by using the logic gates 21 having the logic sidewall spacers 22, to form source/drain 24 of the logic device elements. As shown in the drawings, a high concentration junction may not be formed in the memory region 2.

Figure 1J:
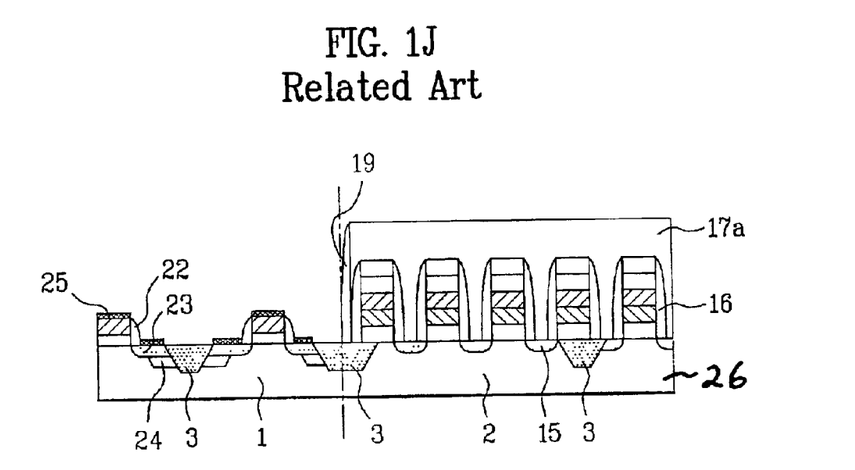

Referring to FIG. 1J, a metal layer of Ti, Co, or Ni is formed on the entire surface of the resultant structure for forming a silicide layer in the logic region 1. This metal layer subjected to silicidation to form a silicide layer 25 on surfaces of each logic gate 21 and source/drain 24 in the logic region 1. Then, portions of the metal layer that made no reaction in the silicidation are removed, and an annealing is conducted to moderate damages given in the silicidation. Then, though not shown, the logic region 1 and the memory region 2 are planarized, and a cell capacitor is formed in the memory region 2 to complete the fabrication of an MDL semiconductor device.

Another related art process for fabricating an MDL semiconductor device will be explained below referring to FIGS. 2A–2F.

Figure 2A:
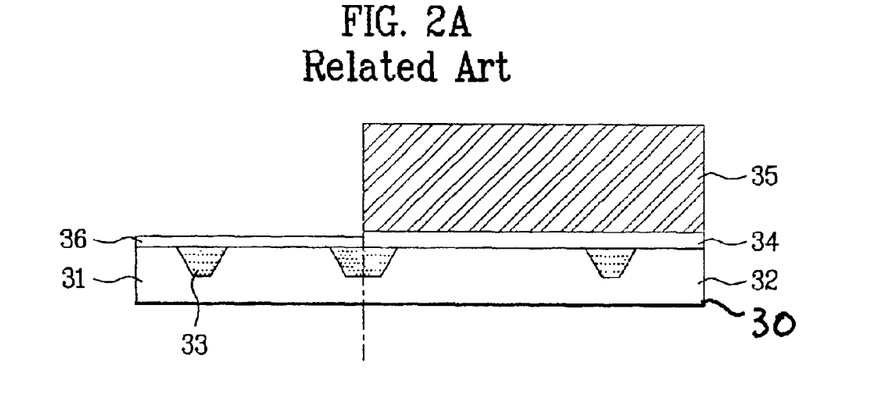
FIGS. 2A–2F illustrate sectional views showing the steps of another related art process for fabricating an MDL semiconductor device.

As shown in FIG. 2A, a device isolation layer 33 is formed in a semiconductor substrate 30 (or well region (not shown)) having a logic region 31 and a memory region 32. In this instance, if an NMOS transistor fabrication region is taken into account, doping concentration in the well regions of the logic region 31 and the memory region 32 may differ. That is, in order to enhance cell refresh characteristics of the memory region 32, doping concentration is made relatively lighter. Then, a first gate oxide film 34 with a first thickness is formed on the entire surface of the substrate 30, and photoresist is coated on the entire surface of the first gate oxide film 34. The photoresist is then selectively patterned to leave the photoresist only in the memory region 32, to form a first photoresist pattern layer 35. The first gate oxide film 34 on the exposed logic region 31 of the substrate 30 is removed by using the first photoresist pattern layer 35. Then, a second gate oxide film 36 with a second thickness thinner than the first thickness of the first gate oxide film 34 is formed on a surface of the substrate 30 in the logic region 31.

Figure 2B:
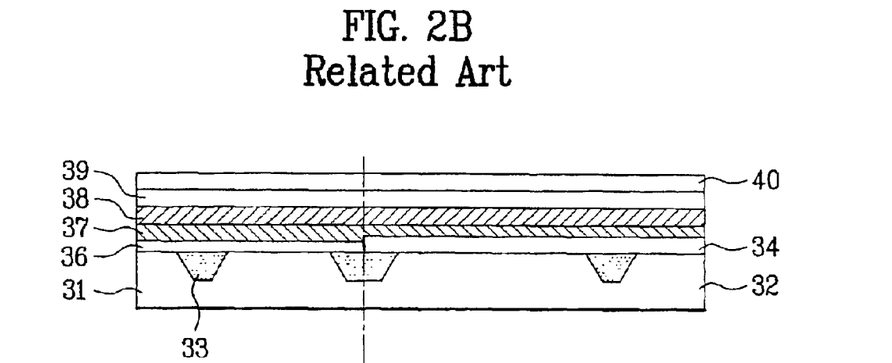

Referring to FIG. 2B, the first photoresist pattern layer 35 is removed from the memory region 32. A gate forming material layer 37 is deposited on the entire surfaces of the logic region 31 and the memory region 32 having the first and second gate oxide films 34 and 36 formed therein to a thickness required for the memory region 32. A tungsten silicide layer 38, a cap oxide film 39, and a cap nitride layer 40 are then formed in succession over the resultant structure.

Figure 2C:
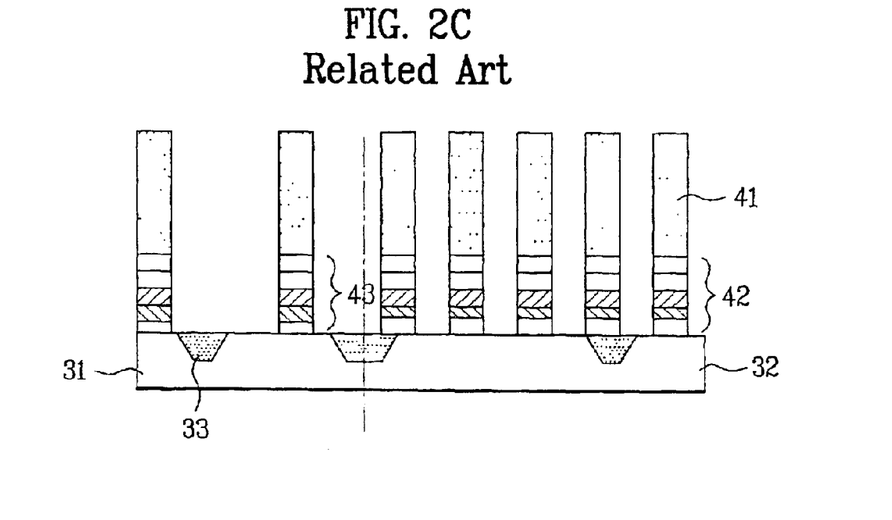

Referring to FIG. 2C, photoresist is coated on the entire surface of the resultant structure, and a second photoresist pattern layer 41 is formed for gate patterning, taking a gate line width in the memory region 32 into account. In this instance, the photoresist in the logic region 31 will be patterned to have a gate line width the same as that of the memory region 32. Then, the gate forming material layer 37, the tungsten silicide layer 38, the cap oxide film 39, and the cap nitride layer 40 are selectively etched by using the second photoresist pattern layer 41, to form gate electrodes 42 in the memory region 32 and gate electrodes 43 in the logic region 31. Thereafter, the second photoresist pattern layer 41 is removed.

Figure 2D:
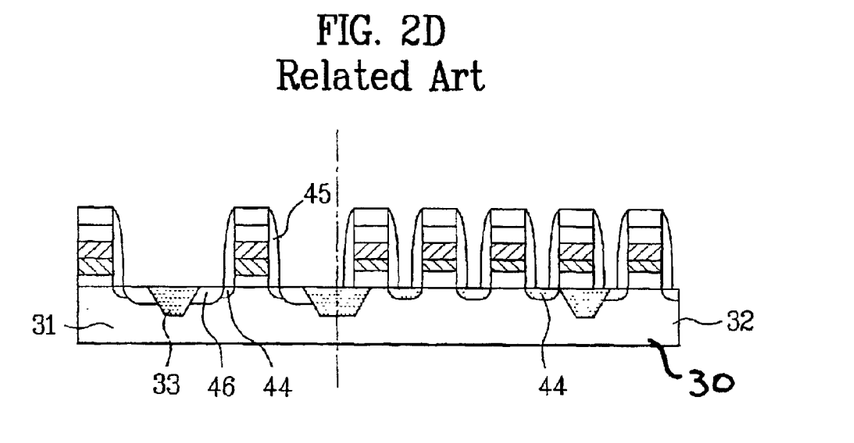

Referring to FIG. 2D, impurities are lightly doped into surfaces of an exposed substrate by using the gate electrodes 42 and 43 as masks, to form LDD regions 44 both in the memory region 32 and the logic region 31. Then, a sidewall forming material layer is formed on the entire surface of the resultant structure, and is subjected to anisotropic etching to form gate sidewalls 45 on the sides of each gate electrode 42 and 43. Impurities are then heavily doped therein to form source/drain regions 46. In this instance, as shown in the drawings, a high concentration junction may not be formed in the memory region 32, taking the cell leakage characteristics into account.

Figure 2E:
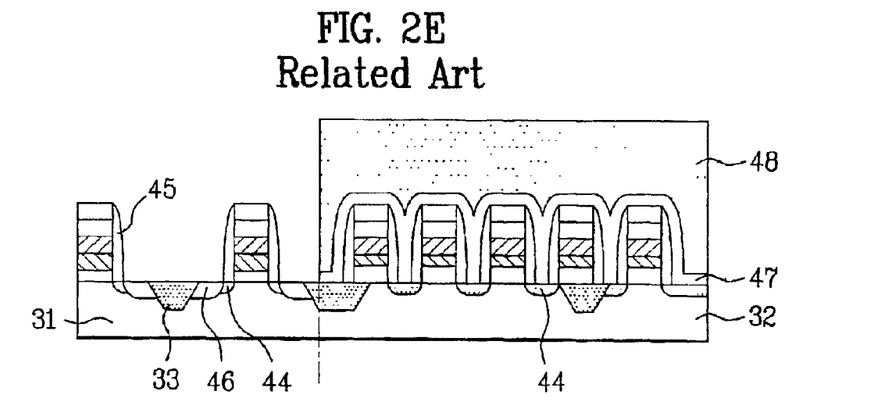

Referring to FIG. 2E, a silicide blocking layer 47 may be formed on the entire resultant surface, and then photoresist is coated on the entire resultant surface. Then, the photoresist is patterned selectively to form a third photoresist pattern layer 48 only in the memory region 32 and not in the logic region 31. The exposed silicide blocking layer 47 in the logic region 31 is selectively etched by using the third photoresist pattern layer 48 as a mask.

Figure 2F:
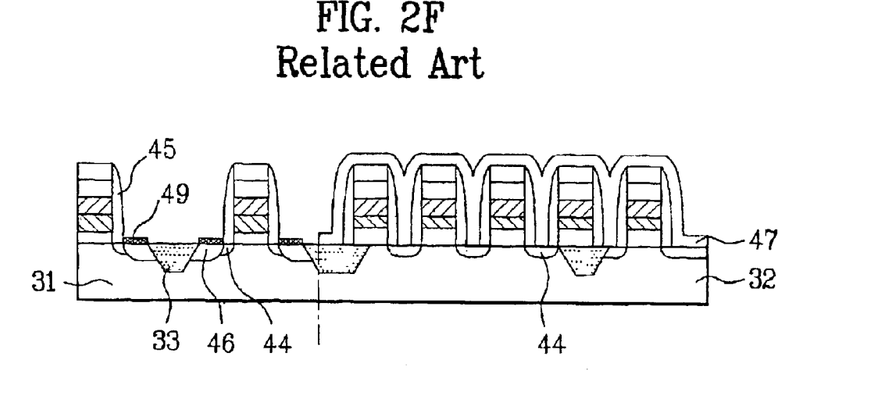

Referring to FIG. 2F, a metal layer is deposited on the entire surface of the resultant structure for forming a silicide layer. This metal layer subjected to silicidation to form a silicide layer 49 on surfaces of the source/drain regions 46 in the logic region 31. An annealing is conducted on the resultant structure to moderate damages to the silicide layer 49 in the silicidation process. Then, though not shown, the logic region 31 and the memory region 32 are planarized, and a cell capacitor is formed in the memory region 32 to complete the fabrication of an MDL semiconductor device.

Another related art process for fabricating an MDL semiconductor device will be explained referring to FIGS. 3A–3E.

Figure 3A:
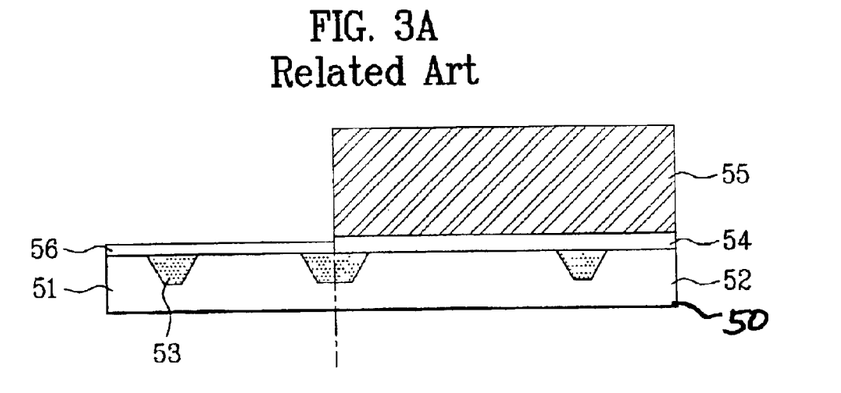
FIGS. 3A–3E illustrate sectional views showing the steps of still another related art process for fabricating an MDL semiconductor device.

As shown in FIG. 3A, a device isolation layer 53 is formed in a semiconductor substrate 50 (or well region (not shown)) having a logic region 51 and a memory region 52. In this instance, if an NMOS transistor fabrication region is taken into account, doping concentration in the well regions of the logic region 51 and the memory region 52 may differ. That is, in order to enhance cell refresh characteristics of the memory region 52, doping concentration is made relatively lighter. Then, a first gate oxide film 54 with a first thickness is formed on the entire surface of the substrate 50, and then photoresist is coated on the first gate oxide film 54. The photoresist is selectively patterned to leave the photoresist only in the memory region 52, thereby forming a first photoresist pattern layer 55 in the memory region 52. The first gate oxide film 54 on the exposed logic region 51 is then removed by using the first photoresist pattern layer 55 as a mask. Then, a second gate oxide film 56 with a second thickness thinner than the first thickness of the first gate oxide film 54 is formed on a surface of the substrate 50 in the logic region 51 and the photoresist 55 is removed.

Figure 3B:
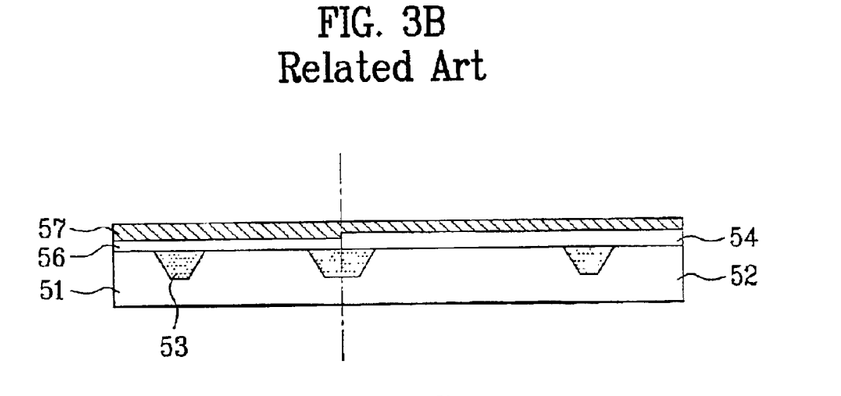

Referring to FIG. 3B, a gate forming material layer 57 is deposited on the entire surfaces of the logic region 51 and the memory region 52 having the first and second gate films 54 and 56 formed therein. The foregoing process progresses centered on the logic region 51 in which the following step is carried out without formation of a capping layer.

Figure 3C:
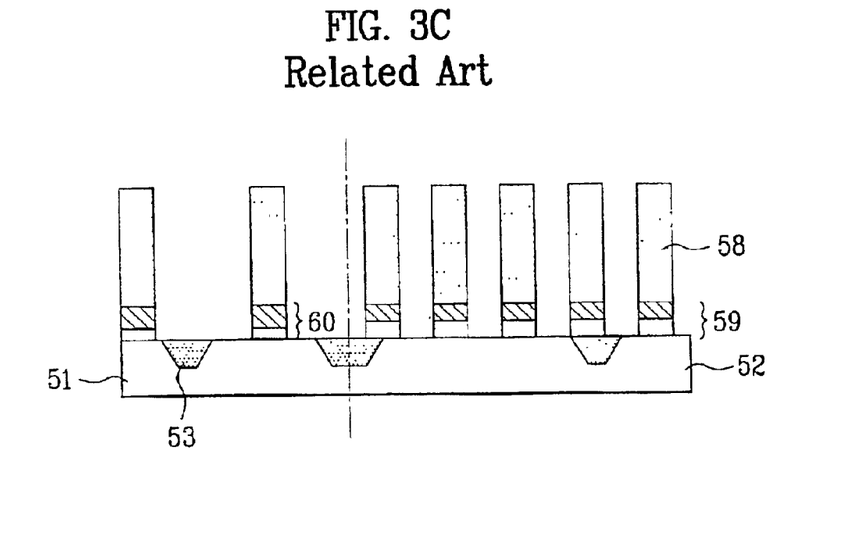

Referring to FIG. 3C, photoresist is coated on the entire surface of the resultant structure, and a second photoresist pattern layer 58 is formed for gate patterning, taking a gate line width in the memory region 52 into account. In this instance, the photoresist in the logic region 51 is also patterned to have a gate line width the same as the memory region 52. Then, the exposed gate forming material layer 57 is selectively etched by using the second photoresist pattern layer 58, to form gate electrodes 59 in the memory region 52 and gate electrodes 60 in the logic region 51. The second photoresist pattern layer 58 is removed.

Figure 3D:
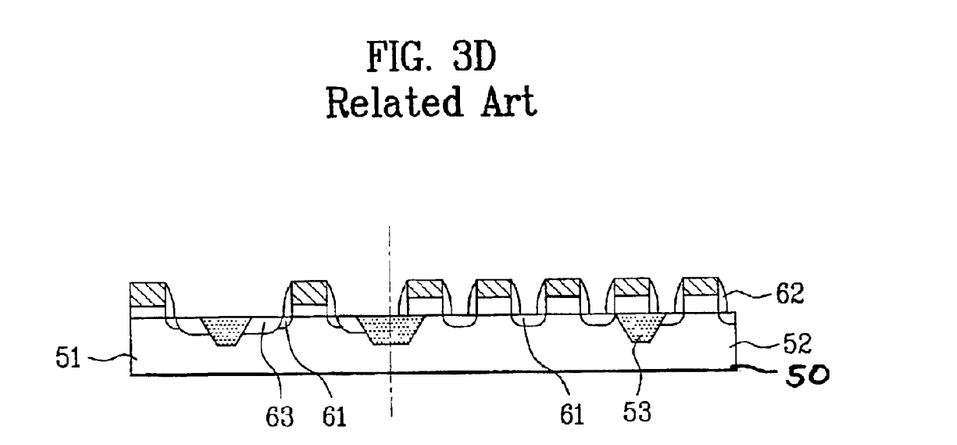

Referring to FIG. 3D, impurities are lightly doped into surfaces of the exposed substrate 50 by using the gate electrodes 59 and 60 as masks, to form LDD regions 61 both in the memory region 52 and the logic region 51. Then, a sidewall forming material layer is formed on the entire surface of the resultant structure, which is subjected to anisotropic etching to form gate sidewalls 62 at the sides of each gate electrode 59 and 60. Impurities are then heavily doped therein to form source/drain regions 63 in the substrate 50. In this instance, as shown in the drawings, a high concentration junction may not be formed in the memory region 52 taking cell leakage characteristics into account.

Figure 3E:
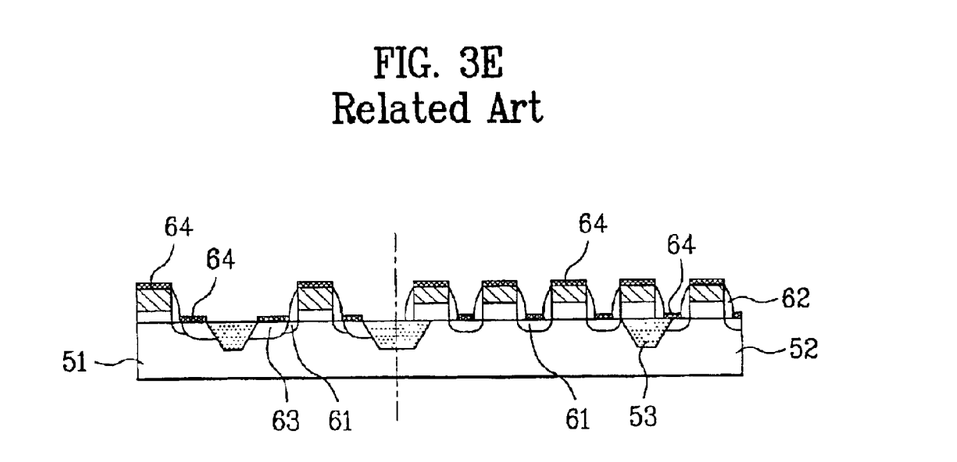

Referring to FIG. 3E, silicon layers are formed on the exposed active regions and top surfaces of the gate electrodes 59 and 60 in the logic region 51 and the memory region 52 by SEG (Selective Epitaxial Growth). Then, a refractory metal layer of, such as Ti, Co, or Ni, is sputtered or chemical vapor deposited on the entire resultant surface. Heat is applied to cause reaction between the silicon layer grown by the SEG and the refractory metal layer to form a silicide layer 64.

The aforementioned related art methods for fabricating an MDL semiconductor device have the following problems.

First, in the process of FIGS. 1A–1J in which polycide structure gates are employed in the memory region and non polycide gates are employed in the logic region, although performance improvement in the logic region and stable operation characteristics in the memory region can be obtained, the fabrication process is complicated and increases a production cost. The difficulty of gate etching in the logic region may deteriorate reproducibility of the fabrication process.

Second, the employment of polycide gate structures both in the memory region and the logic region in the fabrication process shown in FIGS. 2A–2F increases a gate resistance in the logic region. The employment of polycide gate structures both in the memory region and the logic region causes difficulty in formation of a dual gate N+/P+. And, even if the dual gate is formed, a threshold voltage of P+ gate is unstable due to a thermal budget of P+ ions with highly diffusive characteristics. These factors render the overall performance of the logic region poor, and the device susceptible to failure.

Third, the use of SEG in the process of FIGS. 3A–3E in which the gate has a silicide structure makes securing a uniform resistance performance difficult. Particularly, the application of a silicide contact at the storage node in the memory region causes a great variation of the contact resistance at the contact, and thereby increases a leakage current at the storage node which deteriorates a cell refresh characteristic and device yield, significantly.

Fourth, due to the above problems, the related art methods for fabricating an MDL semiconductor device has a poor applicability because the methods are not applicable to formation of a high performance SOC (System On Chip). Moreover, when a gap filling process of memory cells is carried out after the source/drains are formed, the high temperature thermal process that is subsequently needed deteriorates a PMOS transistor in the logic part.

SUMMARY OF THE INVENTION

Accordingly, the present invention is directed to a method for fabricating an MDL semiconductor device that substantially obviates one or more of the problems due to limitations and disadvantages of the related art.

An object of the present invention is to provide a method for fabricating an MDL semiconductor device, in which a silicide process is applicable to a logic region and a memory region selectively without a mask, for thereby enhancing a reliability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating an MDL semiconductor device includes the steps of (a) providing a substrate having a first region and a second region adjoining the first region, (b) forming a first gate forming material layer in the first region, (c) forming a second gate forming material layer in the first region having the first gate forming material layer formed therein and the second region, (d) selectively patterning the second gate forming material layer to form second gates in the second region and a boundary dummy pattern layer at a boundary of the first and second regions, and (e) selectively patterning the first gate forming material layer to form first gates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings. FIGS. 4A–4G illustrate sectional views showing the steps of a process for fabricating an MDL semiconductor device in accordance with a preferred embodiment of the present invention.

The method for fabricating an MDL semiconductor device in accordance with a preferred embodiment of the present invention involves formation of polycide structured gates and making SAC of a storage node contact possible in a memory region, and gap-filling of memory cells after formation of source/drain in a logic region for preventing deterioration of a PMOS transistor in the logic part. The method according to the present invention also involves formation of gate oxide films in the memory region and the logic region in thicknesses required for each of the regions, for securing gate oxide film characteristics proper for each of the regions.

Figure 4A:
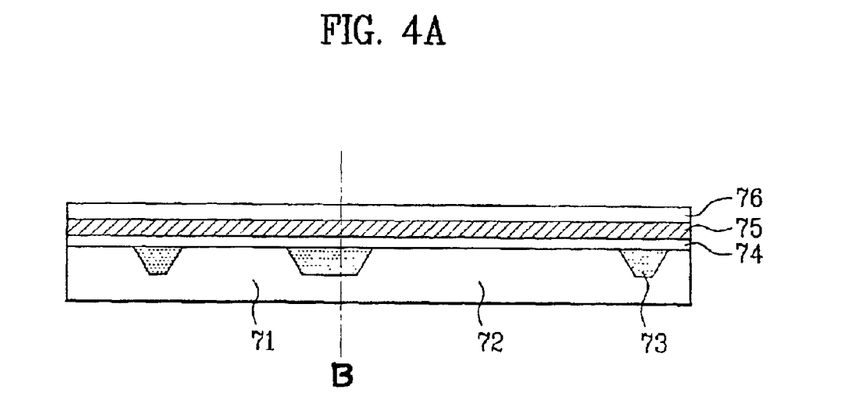
FIGS. 4A–4G illustrate sectional views showing the steps of a process for fabricating an MDL semiconductor device in accordance with a preferred embodiment of the present invention.

Particularly, in the present method, referring to FIG. 4A, a device isolation layer 73 is formed in a semiconductor substrate 70 (or a well region (not shown)) having a logic region 71 and a memory region 72 separately by a boundary line B. In this instance, if an NMOS transistor formation region is taken into consideration, doping concentration in the logic region 71 and the memory region 72 may differ. That is, for improving cell refresh characteristics of the memory region 72, the memory region 72 may be doped relatively lightly. Then, a first gate oxide film 74 with a first thickness and a first gate forming material layer 75 are sequentially formed on the entire surface of the substrate 70. The first gate forming material layer 75 is formed of undoped polysilicon. Then, a first capping layer 76 of oxide, nitride or any other suitable material is formed on the first gate forming material layer 75 for preventing etch damage to the gate layer in the subsequent gate etching process.

Figure 4B:
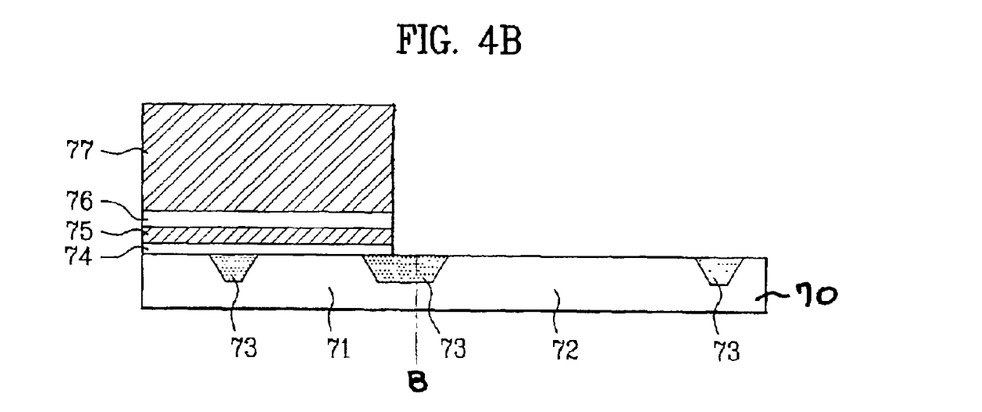

Referring to FIG. 4B, a photoresist layer is formed on the entire surface of the resultant structure, and patterned selectively, thereby forming a first photoresist pattern layer 77 only in the logic region 71. Here, the photoresist layer 77 is patterned such that it is absent near the boundary B of the logic region 71. The first capping layer 76, the first gate forming material layer 75, and the first gate oxide film 74 with the first thickness, which are provided in the memory region 72, are etched selectively by using the first photoresist pattern layer 77 as a mask, so that the substrate 70 in the memory region 72 and the boundary area of the logic region 71 is exposed.

Figure 4C:
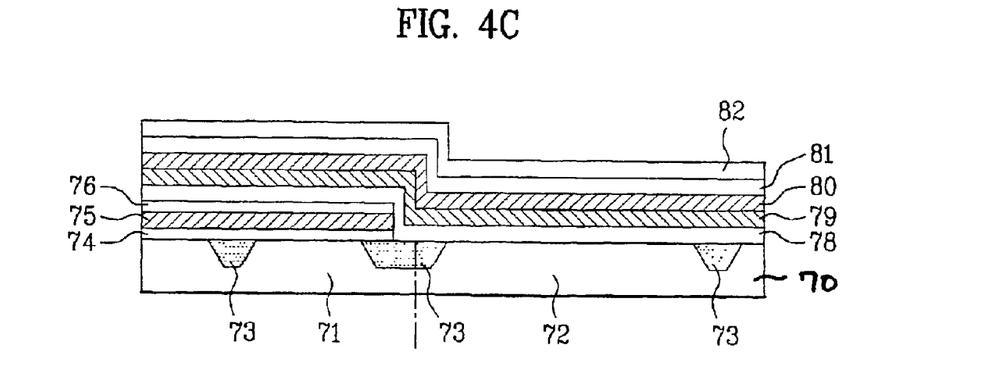

Referring to FIG. 4C, a second gate oxide film 78 with a second thickness thicker than the first thickness of the first gate oxide film 74, a second gate forming material layer 79 for forming a memory, a silicide layer 80 of a refractory metal such as tungsten, and second capping layers 81 and 82 are formed in succession on the entire surface of the substrate 70. In this instance, a polycide structure is employed taking a reliability of the memory and a following capacitor forming process. The second capping layers 81 and 82 are a stack of an oxide film (81) and a nitride film (82), respectively.

Figure 4D:
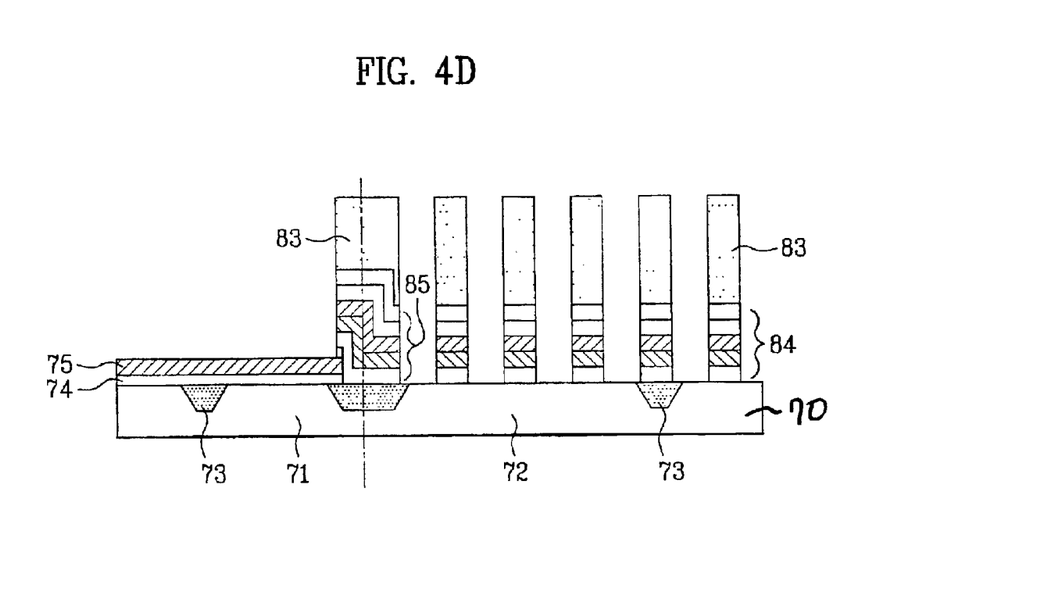

Referring to FIG. 4D, photoresist is applied on the entire surface of the resultant structure and patterned selectively to form a second photoresist pattern layer 83 with a fixed width in a wordline forming region and above the boundary (B) area of the logic region 71 and above the memory region 72 for patterning a wordline in the memory region 72. A stack of the layers 82, 81, 80, 79, and 78 are then etched selectively by using the second photoresist pattern layer 83 as a mask, to form at least one memory gate 84 of a DRAM cell and a boundary dummy pattern layer 85 at the boundary B between the logic and memory regions 71 and 72. In this instance, using the second photoresist pattern layer 83 as a mask, all the layers 76, 78, 79, 80, 81, and 82 in the non-boundary area of the logic region 71 are removed completely, leaving only the first gate oxide film 74 and the first gate forming material layer 75 therein.

Figure 4E:
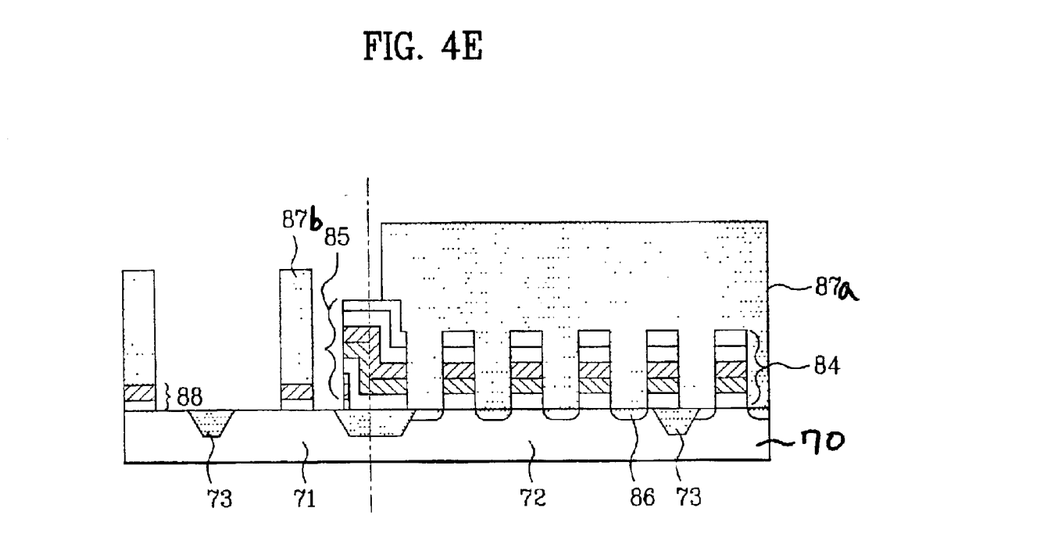

Referring to FIG. 4E, the second photoresist pattern layer 83 is removed, and cell junction regions, i.e., source/drain regions 86 are formed by using the memory gate 84 in the memory region 72 as a mask. The memory source/drain regions 86 are formed by blank ion injection that is made possible by blocking the first gate forming material layer in the logic region 71. Then, photoresist is coated on the entire surface of the resultant structure to form a third photoresist layer 87 (87a, 87b). Only the part of the photoresist layer 87 in the logic region 71 is selectively patterned to form a third photoresist pattern layer 87a as a logic gate forming mask in the logic region 71. The first gate oxide film 74 and the first gate forming material layer 75, both of which are in the logic region 71, are etched selectively by using the third photoresist pattern layer 87b as a mask to form at least one logic gate 88. In the etching of the logic gate 88, since the memory region 72 is covered with the third photoresist layer 87a, there is no damage to the memory gates 84 and that part of the substrate 70.

Figure 4F:
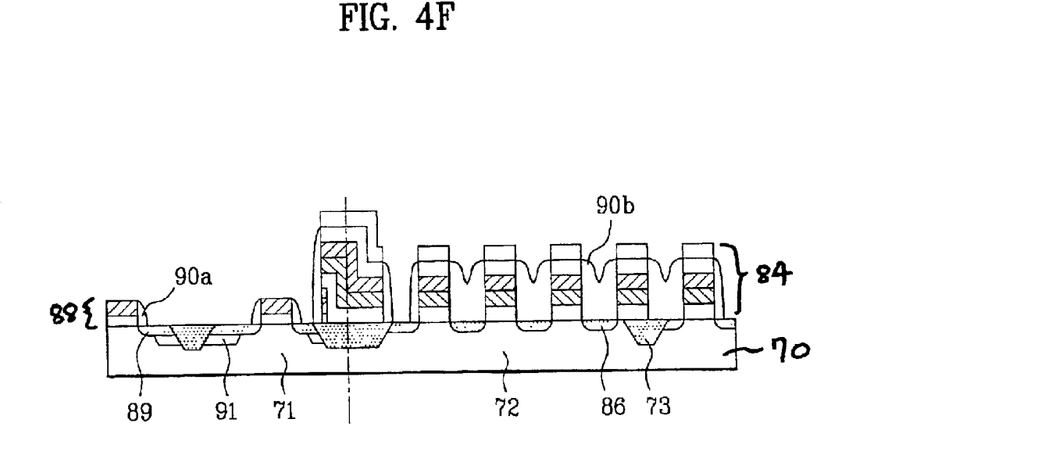

Referring to FIG. 4F, the third photoresist pattern layers 87a and 87b are removed, and the logic region 71 is subjected to LDD ion injection to form LDD regions 89. Then, a sidewall spacer forming material layer is deposited on the entire surface of the resultant structure, and a gap fill forming material layer is deposited in the memory region 72. The sidewall spacer forming material layer is formed in a stack of an oxide film and a nitride film (taking into consideration a subsequent SAC step for a storage node contact). The gap fill forming material layer is formed of BPSG (Boron-Phosphorus-Silicate-Glass), PSG (Phosphorus-Silicate-Glass), HDP (High Density Plasma) oxide film, SOG (Spin On Glass), USG (Undoped Silicate Glass) or other suitable material.

After the sidewall spacer forming material layer and the gap fill forming material layer are deposited, the gap fill forming material layer is etched back. The etch back is preferably a blanket etching without mask. In the etch back process, intervals between the logic gates 88 in the logic region 71, and intervals between the memory gates 84 in the memory region 72 will differ. That is, because the intervals (distance) between the logic gates 88 are greater than intervals (distance) between the memory gates 84, and the heights of the memory gates 84 are about 2–3 times greater than the heights of the logic gates 88, although the gap fill forming material layer is remained in the memory region 72 enough to fill the gaps between the memory gates 84, all the gap fill forming material layer is removed from the logic region 71. After the gap fill forming material layer is removed from the logic region 71 completely, the sidewall spacer forming material layer in the logic region 71 is subjected to anisotropic etching, to form logic gate sidewalls 90a and memory gap fill layers 90b in the memory region 72. Then, impurities are injected heavily into the surfaces of the exposed substrate 70 to form logic source/drain 91 in the logic region 71.

Figure 4G:
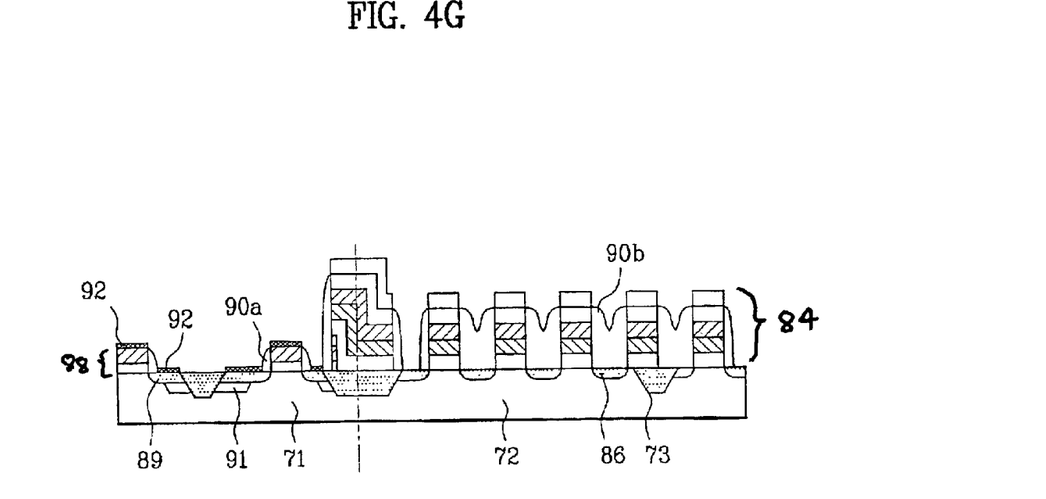

Referring to FIG. 4G, a metal layer is formed of Ti, Co, Ni, or other substrate material on the entire surface of the resultant structure for forming a silicide layer in the logic region 71. This metal layer is subjected to silicidation to form a silicide layer 92 over the surfaces of the logic gate 88 and the logic source/drain 91 in the logic region 71. Then, portions of the metal layer that made no reaction in the silicidation are removed, and an annealing is conducted to moderate damages given in the silicidation. Then, although not shown, the logic region 71 and the memory region 72 are planarized, and a cell capacitor is formed in the memory region 72 to complete the process.

In the foregoing fabrication process, the impurity injection processes for forming the source/drain in the first and second regions (e.g., the logic and memory regions) may be separated for injecting different concentration of impurities. Thus, the foregoing fabrication process of the present invention can effectively satisfy any different characteristic requirements of respective logic devices and memories in a fabrication process of a Merged DRAM Logic device, an Embedded DRAM Logic device, or other suitable device.

As has been explained, the method for fabricating an MDL semiconductor device or other suitable device has at least the following advantages.

First, the formation of the logic region gate oxide films and the memory region gate oxide films that satisfy respective requirements reduces occurrence of defects caused by the gate oxide films.

Second, as the boundary dummy pattern layer is used to separate the source/drain (cell junction region) in the memory region from the logic region, and to conduct separate source/drain forming processes for the memory region and the logic region, all requirements for respective regions can be met completely. Further, since the boundary dummy pattern layer requires no additional mask, but the wordline forming mask, the formation boundary pattern layer does not complicate the fabrication process.

Third, the use of double sidewalls in the memory region satisfies all characteristic requirements in the logic region and the memory region in the process for fabricating an MDL semiconductor device, and reduces a fabrication process difficulty because the following storage node contact may be provided by SAC.

Fourth, device performance can be improved significantly since the impurity doping concentration for the logic gates can be controlled to satisfy a requirement for the region by carrying out source/drain formation separately for the memory region and the logic region.

Fifth, carry out the gap filling in the memory region before formation of the source/drain prevents deterioration of the PMOS transistor and the silicide layer in the device.

It will be apparent to those skilled in the art that various modifications and variations can be made in the method for fabricating a semiconductor device of the present invention without departing from the spirit or scope of the invention. Thus, it is intended that the present invention cover the modifications and variations of this invention provided they come within the scope of the appended claims and their equivalents.

What is claimed is:

1. A method for fabricating a memory-logic combined semiconductor device, the method comprising the steps of:

(a) providing a substrate having a first region and a second region adjoining the first region;

(b) forming a first gate forming material layer in the first region;

(c) forming a second gate forming material layer in the second region and in the first region having the first gate forming material layer formed therein;

d) selectively patterning the second gate forming material layer simultaneously with completely removing the second gate forming material layer in the first region except in a boundary area between the first and second regions to form second gates in the second region and to form a boundary dummy pattern layer at the boundary area of the first and second regions; and (e) selectively patterning the first gate forming material layer to form first gates in the first region.

2. A method as claimed in claim 1, wherein the first gate forming material layer is formed of polysilicon, and the method further comprises the step of (f) forming a cap insulating layer on the first gate forming material layer.

3. A method as claimed in claim 1, wherein the second gate forming material layer is a stack of a polysilicon layer and a silicide layer, and the method further comprises the step of (g) forming a cap insulating layer on the silicide layer.

4. A method as claimed in claim 1, further comprising the step of:

(h) forming first and second gate oxide films of different thicknesses under the first and second gate forming material layers, respectively, before formation of the first and second gate forming material layers.

5. A method as claimed in claim 1, further comprising the step of:

(l) forming source/drain on sides of the first and second gates in the first and second regions by conducting separately impurity ion injection processes for the first and second regions.

6. A method as claimed in claim 1, further comprising the step of:

(j) forming a gap fill forming material layer only in the second region by forming a sidewall forming material layer and the gap fill forming material layer in succession on an entire surface of the substrate after formation of the first and second gates and by subjecting the sidewall forming material layer and the gap fill forming material layer to anisotropic etching.

7. A method as claimed in claim 1, wherein the first and second regions are logic and memory regions, respectively.

8. A method as claimed in claim 1, wherein the memory-logic combined semiconductor device is a Merged DRAM Logic (MDL) device or an Embedded DRAM Logic (EDL) device.

9. A method for fabricating an MDL semiconductor device having first and second regions with different characteristics, the method comprising the steps of:

(a) providing a substrate including first and second regions;

(b) forming a first gate oxide film, a first gate forming material layer, and a first capping layer on the first region;

(c) forming a second gate oxide film, a second gate forming material layer, a second capping layer on an entire surface of the substrate after the step (b);

(d) selectively patterning the second gate oxide film, the second gate forming material layer, and the second capping layer to form gates in the second region simultaneously with removing the second capping layer, and the first capping layer in the first region at the same time and to form a boundary dummy pattern layer at a boundary area of the first and second regions;

(e) forming a source/drain in the second region; and (f) after the source/drain is formed in the second region, selectively removing the first gate oxide film and the first gate forming material on the first region to form gates in the first region.

10. A method as claimed in claim 9, further comprising the steps of:

(g) forming LDD regions in the first region;

(h) after the LDD regions are formed in the first region, forming a sidewall forming material layer and a gap fill forming material layer in succession on an entire surface of the substrate, and etching the gap fill forming material layer in the first region.

11. A method as claimed in claim 10, further comprising the steps of:

(i) forming gate sidewalls at sides of the gates in the first region;

(j) forming a source/drain between the gates in the first region; and (k) forming silicide layers on surfaces of the gates and the source/drain in the first region.

12. A method as claimed in claim 9, wherein the first region is a logic device region, and the second region is a memory device region.

13. A method as claimed in claim 10, wherein the second region is masked by the gap fill forming material layer in formation of the LDD regions in the first region.

14. A method as claimed in claim 10, wherein the gap fill forming material layer is remained between the gates in the second region by blanket etching using differences in distances between the gates in the first and second regions, when removing the gap fill forming material layer from the first region in the step (h).

15. A method as claimed in claim 9, further comprising the step of (l) forming a silicide layer of a refractory metal between the second gate forming material layer and the second capping layer.

16. A method as claimed in claim 15, wherein the silicide layer in the first region is removed when the gates in the second region are patterned such that the silicide layer exists only on top of the gates in the second region, but not on top of the gates in the first region once the gates in the first and second regions are formed.

17. A method as claimed in claim 9, wherein the first gate oxide film has a thickness greater than a thickness of the second gate oxide film.

18. A method as claimed in claim 11 wherein impurity concentrations of the source/drain in the first region and the source/drain in the second region differ from each other.

19. A method as claimed in claim 10, wherein the sidewall forming material layer includes a stack of an oxide film and a nitride film, and the gap fill forming material layer is formed of one selected from a group of materials including BPSG, PSG, HDP oxide film, SOG, and USG.

20. A method for fabricating a memory-logic combined semiconductor device, the method comprising the steps of:

(a) providing a substrate having a first region and a second region adjoining the first region;

(b) forming a first gate forming material layer in the first region;

(c) forming a second gate forming material layer in the second region and in the first region having the first gate forming material layer formed therein;

(d) selectively patterning the second gate forming material layer to form second gates in the second region and to form a boundary dummy pattern layer at a boundary area of the first and second regions;

(e) selectively patterning the first gate forming material layer to form first gates in the first region; and (f) forming a gap fill forming material layer only in the second region by forming a sidewall forming material layer and the gap fill forming material layer in succession on an entire surface of the substrate after formation of the first and second gates and by subjecting the sidewall forming material layer and the gap fill forming material layer to anisotropic etching.

* * * * *